(12) United States Patent
Dawson

(10) Patent No.: US 6,677,647 B1
(45) Date of Patent: Jan. 13, 2004

(54) ELECTROMIGRATION CHARACTERISTICS OF PATTERNED METAL FEATURES IN SEMICONDUCTOR DEVICES

(75) Inventor: Robert Dawson, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 921 days.

(21) Appl. No.: 09/153,807

(22) Filed: Sep. 15, 1998

Related U.S. Application Data

(63) Continuation-in-part of application No. 08/992,953, filed on Dec. 18, 1997, now abandoned.

(51) Int. Cl.$^7$ ................................................ H01L 29/72
(52) U.S. Cl. ...................... 257/368; 257/763; 257/764; 257/765; 257/767; 438/656; 438/669; 438/672
(58) Field of Search ................................ 257/368, 763, 257/764, 765, 767; 438/669, 672, 656

(56) References Cited

U.S. PATENT DOCUMENTS

| | | | | |
|---|---|---|---|---|
| 5,763,948 A | * | 6/1998 | Sumi | 257/767 |
| 5,793,113 A | * | 8/1998 | Oda | 257/767 |
| 5,847,463 A | * | 12/1998 | Trivedi et al. | 257/767 |

* cited by examiner

*Primary Examiner*—Edward Wojciechowicz

(57) ABSTRACT

The electromigration characteristics of patterned metal features, such as metal lines, in semiconductor devices is improved by applying a conductive layer to substantially surround and encapsulate the patterned metal features. A portion of the conductive layer may be removed to form conductive sidewall spacers on the side surfaces of the patterned metal features. In an embodiment of the invention, the conductive layer comprises a first layer of titanium and a second layer of titanium-nitride thereon.

33 Claims, 3 Drawing Sheets

ELECTROMIGRATION CHARACTERISTICS OF PATTERNED METAL FEATURES IN SEMICONDUCTOR DEVICES

This application is a continuation-in-part of application Ser. No. 08/992,953, filed Dec. 18, 1997, the disclosure of which is incorporated herein by reference now abandoned.

FIELD OF THE INVENTION

The present invention relates to semiconductor devices and more specifically, to a method for improving the electromigration characteristics of patterned metal features in semiconductor devices.

BACKGROUND OF THE INVENTION

Conventional semiconductor devices comprise a substrate and a plurality of interleaved dielectric and conductive layers comprising circuit patterns electrically connected by a conductive interconnection pattern metal. When metal interconnections in a semiconductor device are operated at relatively high current densities, the phenomenon of electromigration occurs which can lead to the failure of the semiconductor device. In the context of semiconductor devices, electromigration includes the movement of metal ions under the influence of electrical current and mechanical stress. Collisions between electrons and metal ions transfer momentum to the metal ions, causing the metal ions to move in the direction of current flow, which is usually toward the positive terminal. Also, patterned metal features that are operated high currents, or at a temperature relatively close to their melting points, are particularly susceptible to electromigration.

In semiconductor devices, electromigration in metal connections, such as aluminum or an alloy thereof collectively referred to hereinafter as Al, typically causes three types of failures. First, electromigration can cause metal ions to pile up in regions of an Al connection to form what are commonly referred to as "hillocks" causing shorts between adjacent patterned metal features. Second, electromigration can cause metal ion voids in regions of an Al connection thereby increasing resistance and, in extreme circumstances, can cause opens circuits in the Al connection. Finally, electromigration can form etch pits in contacts to silicon where electrons leave silicon and enter Al.

Several techniques have been used to minimize electromigration in patterned metal features. One such technique involves adding impurities, such as copper (Cu) or titanium (Ti), to modify the properties of the patterned metal features at the grain boundaries. Typical impurity levels for Cu range from 0.5 to 4.0%. Although this technique can reduce electromigration, the added impurities tend to increase the resistance of the patterned metal features, thereby adversely affecting circuit performance. Moreover, patterned metal features containing added impurities can be more difficult to etch. For example, Al—Cu alloys become harder to dry etch as the Cu content is increased.

Another prior technique for minimizing electromigration involves forming a barrier layer, typically made of Ti, between a patterned metal feature and the underlying dielectric. In addition, a top cap layer, typically referred to as an anti-reflective coating, has been formed on the patterned metal feature.

Referring to FIG. 1, a conventional patterned metal feature structure, such as a metal line, is designated by the reference numeral 100. A dielectric layer 102, typically made from silicon dioxide ($SiO_2$), is formed on a substrate 104, typically silicon (Si).

A barrier layer 106, typically made of Ti, is formed on top of dielectric layer 102. A primary conductive layer 108, such as Al, is formed on barrier layer 106. Finally, an anti-reflective coating 110, such as TiN is formed on metal line 108.

The use of barrier layer 106 and anti-reflective coating 110 tends to reduce electromigration in metal line 108, particularly vertical electromigration through a via, albeit at the cost of increasing the sheet resistance of metal layer 108. Anti-reflective coating 110 can also act as an etch stop layer.

Conventional practices also comprise annealing barrier layer 106 and anti-reflective coating 110 to diffuse Ti into the Al metal layer 108 to form $TiAl_3$ at interfaces 112 and 114, to further reduce electromigration. However, this conventional technique further increases the sheet resistance of metal line 108.

Accordingly, there is a need for semiconductor devices exhibiting reduced electromigration failures. There is a particular need for methodology and semiconductor devices comprising patterned metal features exhibiting reduced electromigration.

SUMMARY OF THE INVENTION

An object of the present invention is a semiconductor device comprising patterned metal features exhibiting reduced electromigration.

Another object of the present invention is a method of manufacturing a semiconductor device exhibiting reduced electromigration.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According the present invention, the foregoing and other objects are achieved in part by a semiconductor device comprising a substrate, a dielectric layer formed on the substrate, a patterned metal feature formed on the dielectric layer, wherein the patterned metal feature has a top surface, a bottom surface and side surfaces, and a conductive layer formed on at least the side surfaces of the patterned metal feature.

In another aspect of the present invention, a portion of the conductive layer is removed to provide one or more conductive sidewall spacers on the side surfaces of the patterned metal feature. Embodiments include conductive sidewall spacers formed from two layers of conductive material, such as a first layer of Ti and a second layer of titanium-nitride.

Another aspect of the invention is a method of manufacturing a semiconductor device which method comprises providing a substrate, forming a dielectric layer on the substrate, forming a patterned metal feature on the dielectric layer, wherein the patterned metal feature has a top surface, a bottom surface and side surfaces, and forming a conductive layer on at least the side surfaces of the patterned metal feature.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Embodiments of the invention are illustrated by way of example, and not by way of limitation, in the figures of the accompanying drawings in which like reference numerals refer to similar elements and in which.

DETAILED DESCRIPTION OF THE PREFERRED EMBODIMENT

Conventional approaches in addressing electromigration failures in semiconductor devices involve incorporating impurities and employing barrier and/or antireflective coatings. In accordance with the present invention, electromigration in patterned metal features is significantly reduced by applying a conductive layer on the patterned metal features. Embodiments include forming conductive sidewall spacers on the side surfaces of patterned metal features substantially surrounding and encapsulating the patterned metal features with a conductive layer.

Encapsulating patterned metal features with a conductive barrier, or forming conductive sidewall spacers on the side surfaces of patterned metal features, is believed to freeze the grain boundaries of the patterned metal features, thereby preventing grain boundary movement and growth, which significantly improves the electromigration characteristics of the patterned metal features. The operative mechanism responsible for the significant reduction in electromigration of patterned metal features achieved by the present invention is not known with certainty. However, it is believed that the use of conductive sidewall spacers and/or encapsulation freezes the grain boundaries, thereby preventing grain boundary movement and growth. Electromigration occurs predominantly along metal grain boundaries where the activation energy is lowest. For internal lines in a semiconductor device, the activation energy is usually lowest along the edges.

Figure 1:
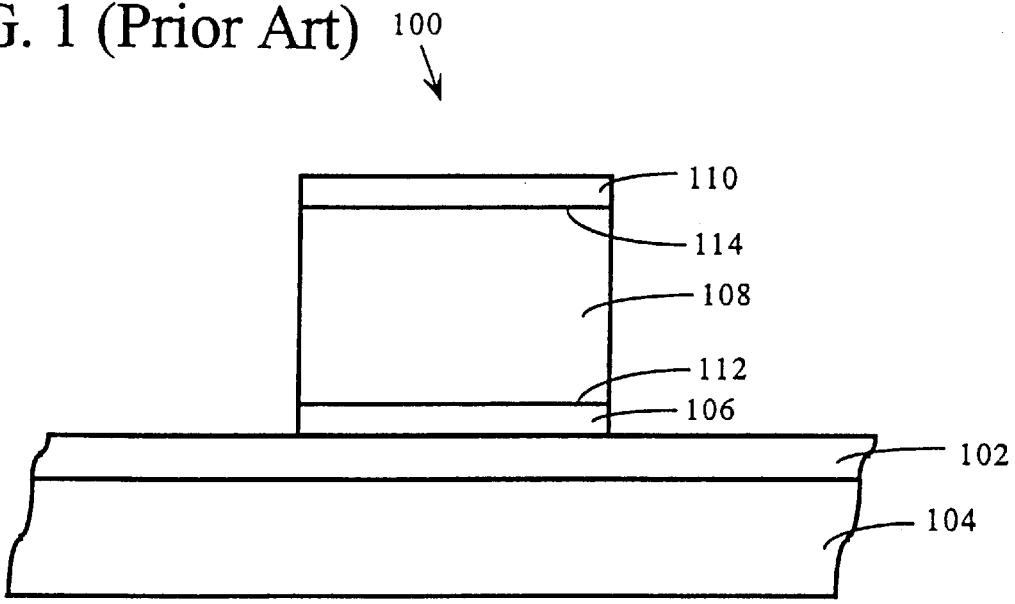
FIG. 1 schematically illustrates a conventional patterned metal feature structure in the form of a metal line.
Figure 2:
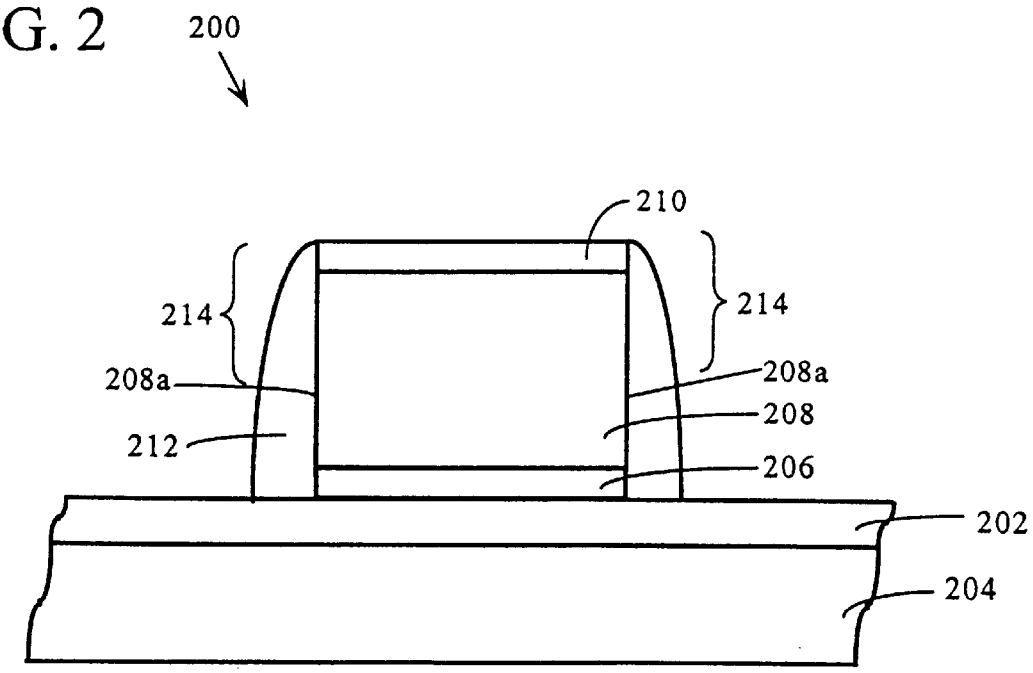
FIG. 2 schematically illustrates a patterned metal feature structure in the form of a metal line made according to an embodiment of the invention.

FIG. 2 schematically illustrates a patterned metal feature structure 200 in accordance with an embodiment of the present invention. A dielectric layer 202, typically made SiO$_2$, is formed on top of a substrate 204, which typically comprises Si.

A barrier layer 206, typically Ti or tungsten (W), is formed on dielectric layer 202. A metal layer 208, typically Al, is formed on barrier layer 206. An anti-reflective coating 210, typically Ti, is formed on metal line 208. The composite is patterned to form a metal line.

A conductive layer (not illustrated) is applied to the substrate on barrier layer 206, metal line 208 and antireflective coating 210, and then patterned, as by anisotropic etching, to form conductive sidewall spacers 212 on side surfaces 208a of Al layer 208. Aspects of this embodiment include sizing conductive sidewall spacers 212 to cover portions of side surfaces 208a of Al layer 208 as well as the entire side surfaces 208a of Al layer 208. Conductive sidewall spacers 212 are generally of uniform thickness, except for top portions 214, that are located near the top of metal line 208 and which overlap anti-reflective coating 210. Top portions 214 are generally the thinnest portion of conductive sidewall spacers 212 because conventional etching processes used to form conductive sidewall spacers 212, from the previously applied conductive layer, cause more material to be removed from top portions 214 as explained in more detail below.

Conductive sidewall spacers 212 typically comprise a refractory material, such as titanium, tungsten, tantalum, or tantalum nitride and have a melting point greater than or equal to about 1500° C. For conductive sidewall spacers 212 made from Ti, a thickness in the range of about 10 to about 350 Angstroms (Å) has been found suitable. However, the thickness of conductive sidewall spacers 212 may vary depending upon the particular material and methodology employed.

According to another embodiment of the invention, conductive sidewall spacers 212 comprise a composite of two layers of conductive material. The first layer typically has a thickness of about 10 Å to about 350 Å. Since metals such as Ti tend to diffuse into the Al metal line 208 to form TiAl$_3$, a second layer of a conductive material that does not readily diffuse into Al is applied over the first layer. For example, if the first layer is Ti, a second layer of titanium nitride (TiN), typically having a thickness of about 50 Å to about 1000 Å, is formed on the first layer. The second layer of TiN may then be removed if single layer conductive sidewall spacers 212 are desired. The deposition of TiN in semiconductor processing is well known in the art. See, for example "Silicon Processing For The VLSI Era," Vol. 1, Process Techniques, p. 386 by Stanley Wolf and Richard Tauber.

Figure 3A:
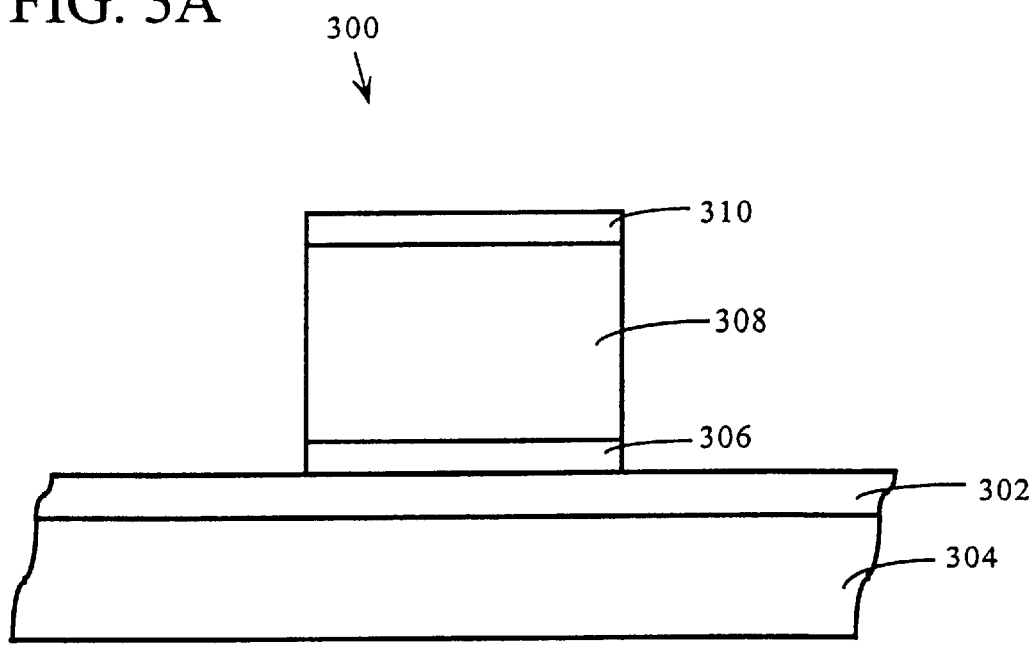
FIGS. 3A–3C illustrate relevant processing steps for manufacturing a patterned metal feature structure in the form of a metal line in accordance with an embodiment of the invention.
Figure 3B:
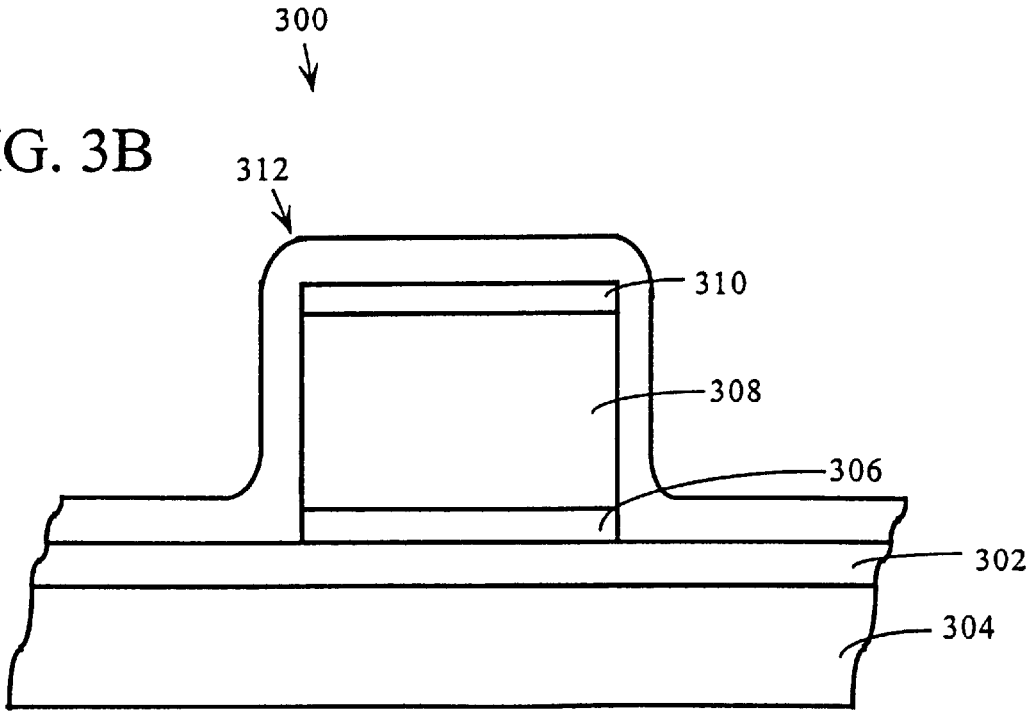
Figure 3C:
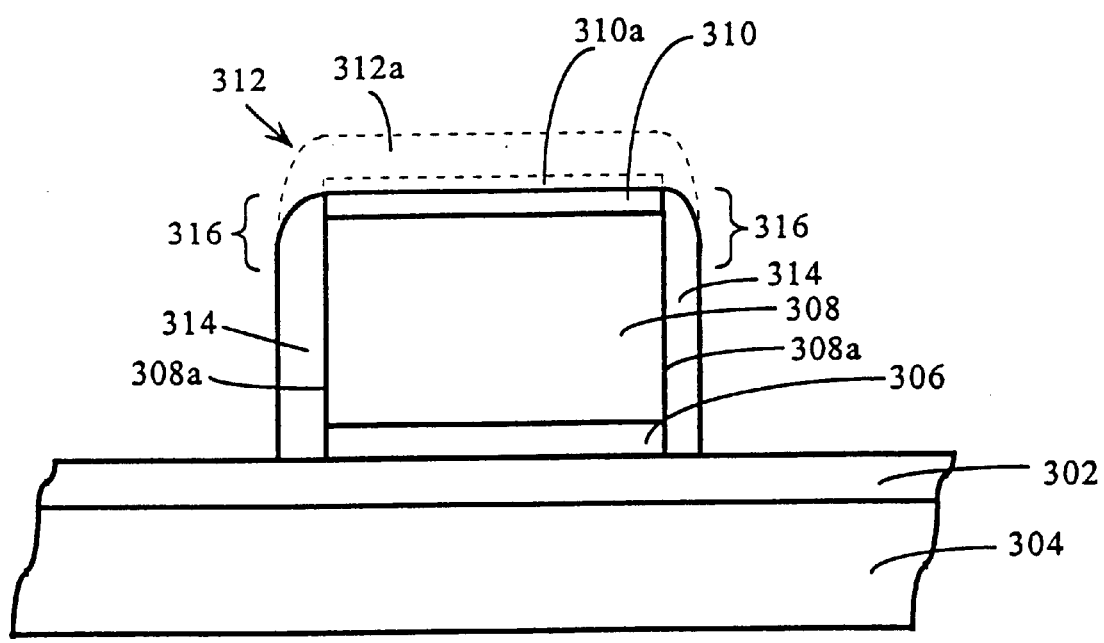

The processing steps involved in manufacturing a semiconductor device having a patterned metal feature with improved electromigration characteristics according to an embodiment of the invention is illustrated in FIGS. 3A–3C.

Referring to FIG. 3A, a dielectric layer 302, such as SiO$_2$, is formed on a substrate 304, such as Si. A barrier layer 306, typically Ti, is formed on dielectric layer 302. A layer of primary conductive material 308, such as Al, is formed on barrier layer 306. An anti-reflective coating 310, typically Ti, is formed on layer 308. Structure 300 may be formed using conventional semiconductor fabrication techniques, the composite is then patterned, as by etching to form a metal feature 300, such as a conductive line.

A conductive layer 312 is then applied on patterned metal feature structure 300, as illustrated in FIG. 3B. Conductive layer 312 may be applied to structure 300 using conventional physical vapor deposition (PVD) or chemical vapor deposition (CVD) technique, such as the TiN deposition process involving decomposing an organic in U.S. patent application Ser. No. 08/924,131 filed on Sep. 5, 1997 the entire disclosure of which is hereby incorporated herein by reference. Encapsulating the entire conductive line 300 including barrier layer 306, Al layer 308 and anti-reflective coating 310, with conductive layer 312 is believed to freeze the grain boundary of metal line 308, thereby significantly reducing electromigration.

According to another embodiment of the invention, conductive layer 312 is a composite comprising two or more layers of conductive material. For example, a first layer of Ti is applied to Al layer 308, which diffuses into the Al to form TiAl₃, followed by a second layer of TiN on the first layer of Ti, which is resistant to diffusion into the Al metal line 308. Other metals and alloys may also be used depending upon the particular situation.

FIG. 3C illustrates the removal of a portion 312a of conductive layer 312 to form conductive sidewall spacers 314 on side surfaces 308a of metal line 308. The removal of portion 312a of conductive layer 312 may be accomplished using conventional semiconductor processing etch techniques.

Standard etching techniques typically remove more of conductive layer 312 directly exposed to the etching process. Consequently, conductive sidewall spacers 314 tend to be the thinnest at top portions 316. In addition, most etch processes will remove a portion 310a of anti-reflective coating 310 which typically represents up to about 30% of anti-reflective coating 310.

Although embodiments of the invention have been described in the context of a metal line 308 comprising Al layer formed on top of a barrier layer 306 and a anti-reflective coating 310 formed on top of the Al layer 308, the invention is also applicable to patterned metal features fabricated with or without barrier layers and/or anti-reflective coatings.

The invention is not limited to metal wires of a particular size, geometry or composition. For example, the invention may be used with any size wires including wires that are less than 0.25 microns in size. Although the metal wires depicted in the various figures are rectangular, the invention may be used with metal wires of other shapes, including irregularly shaped metal wires. Although embodiments of the invention have been described in the context of being used with Al wires, the invention may be used with wires of other compositions. For example, the invention may be used with wires made from other materials, including metals to which impurities have been added, such as Al with Cu added.

Although embodiments of the invention have been described in the context of a patterned metal feature structure formed on top of a dielectric that is formed on top of a substrate, the invention is also applicable to patterned metal features created using damascene fabrication techniques.

For patterned metal features created using damascene fabrication techniques, the conductive layer is formed in the troughs before the troughs are filled with metal to form the patterned metal features. For conductive layers formed from multiple layers, such as Ti and TiN, a layer of TiN is deposited into the trough first, followed by a second layer of Ti. Then, when the metal, such as Al, is deposited into the prepared trough, the layer of Ti diffuses into the Al to form TiAl₃, while the layer of TiN does not diffuse into the Al. The conductive layer may also be etched, before the trough is filled with metal, to remove the portions of the conductive layer outside the trough and in the middle of the bottom of the trough, forming conductive sidewall spacers on the sides of the trough.

The invention provides several advantages over prior approaches for reducing electromigration in patterned metal features in semiconductor devices. The encapsulation of patterned metal features is believed to freeze the grain boundaries of the patterned metal features preventing boundary movement and growth, thereby significantly improving the electromigration characteristics of the patterned metal features. This benefit of reducing electromigration in patterned metal features lessens the likelihood that metal ion hillocks or voids will form on the patterned metal features, thereby increasing the reliability of the patterned metal features and the semiconductor devices in which they are used.

In the previous description, specific details have been set forth, such as specific materials, structures, chemicals, processes, etc., in order to provide a thorough understanding of the invention. However, it will be apparent that the invention may be practiced without these specific details. In other instances, well-known processing structures have not been described in detail in order to avoid unnecessarily obscuring the invention.

In addition, although the invention has been described with reference to specific embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. A patterned metal feature of a semiconductor device comprising:
   a substrate;
   a dielectric layer formed on the substrate;
   a patterned metal line formed on the dielectric layer, wherein the patterned metal line has a top surface, a bottom surface and side surfaces; and
   a conductive layer formed at least on the side surfaces of the patterned metal line.

2. The patterned metal feature of a semiconductor device according to claim 1, wherein the conductive layer is formed on and substantially surrounds the patterned metal conductive line.

3. The patterned metal feature of a semiconductor device according to claim 1, wherein the conductive layer comprises a material selected from the group consisting of titanium, titanium-nitride, tungsten, tungsten-nitride, tantalum and tantalum-nitride.

4. The patterned metal feature of a semiconductor device according to claim 3, wherein the conductive layer has a thickness of about 10 Å to about 350 Å.

5. The patterned metal feature of a semiconductor device according to claim 1, wherein the conductive layer comprises a material having a melting point of about 1500° C. to about 3500° C.

6. The patterned metal feature of a semiconductor device according to claim 1, wherein the conductive layer is a composite comprising:
   a first conductive layer; and
   a second conductive layer on the first conductive layer.

7. The patterned metal feature of a semiconductor device according to claim 6, wherein the first conductive layer comprises titanium and the second conductive layer comprises titanium-nitride.

8. The patterned metal feature of a semiconductor device according to claim 7, wherein the first conductive layer has a thickness of about 10 Å to about 350 Å, and the second conductive layer has a thickness of about 50 Å to about 1000 Å.

9. The patterned metal feature of a semiconductor device according to claim 7, wherein the patterned metal line comprises aluminum or an alloy thereof.

10. The patterned metal feature of a semiconductor device according to claim 1, wherein the conductive layer comprises one or more conductive sidewall spacers formed on the side surfaces of the patterned metal line.

11. The patterned metal feature of a semiconductor device according to claim 1, wherein
   the patterned metal line comprises, sequentially:
      a bottom conductive layer;

an intermediate metal layer;

an anti-reflective coating; wherein, the conductive layer comprises one or more conductive sidewall spacers formed on the side surfaces of the patterned metal line.

12. The patterned metal feature of a semiconductor device according to claim 1, wherein the conductive layer improves the resistance of the patterned metal line to electromigration.

13. A method of manufacturing a patterned metal feature of a semiconductor device, which method comprises:

providing a substrate;

forming a dielectric layer on the substrate;

forming a patterned metal line on the dielectric layer, wherein the patterned metal line has a top surface, a bottom surface and side surfaces; and forming a conductive layer on at least the side surfaces of the patterned metal line.

14. The method according to claim 13, wherein the conductive layer is formed on and substantially surrounding the patterned metal line.

15. The method according to claim 13, wherein the conductive layer comprises a material selected from the group consisting of titanium, titanium-nitride, tungsten, tungsten-nitride, tantalum and tantalum-nitride.

16. The method according to claim 15, wherein the conductive layer has thickness of about 10 Å to about 350 Å and substantially surrounds the patterned metal line.

17. The method according to claim 13, wherein the conductive layer comprises a material having a melting point of about 1500° C. to about 3500° C.

18. The method according to claim 14, comprising forming the conductive layer on and substantially surrounding the patterned metal line by:

forming a first conductive layer on and substantially surrounding the patterned metal line, and forming a second conductive layer on the first conductive layer.

19. The method according to claim 18, wherein the first conductive layer comprises titanium and the second conductive layer comprises titanium-nitride.

20. The method according to claim 19, wherein the first conductive layer has a thickness of about 10 Å to about 350 Å and the second conductive layer has a thickness of about 50 Å to about 1000 Å.

21. The method according to claim 19, wherein the patterned metal line comprises Al or an alloy thereof.

22. The method according to claim 13, wherein the step of forming a conductive layer on and substantially surrounding the patterned metal line includes the step of forming one or more conductive sidewall spacers on the side surfaces of the patterned metal line.

23. The method according to claim 13, comprising:

forming the patterned metal line on the dielectric layer by:

forming a bottom conductive layer, forming an intermediate metal layer on the bottom conductive layer;

forming an anti-reflective coating on the intermediate metal layer; and patterning the conductive layer to form one or more conductive sidewall spacers on the side surfaces of the patterned metal line.

24. A method of manufacturing a patterned metal feature of a semiconductor device, which method comprises:

providing a substrate;

forming a dielectric layer on the substrate;

forming a trough in the dielectric layer, wherein the trough has a bottom surface and side surfaces;

forming a conductive layer on at least the side surfaces of the trough;

removing any portion of the conductive layer on the middle of the bottom surface; and forming a patterned metal line in the trough.

25. The method according to claim 24, wherein the conductive layer is formed in and substantially covering the trough.

26. The method according to claim 24, wherein the conductive layer comprises a material selected from the group consisting of titanium, titanium-nitride, tungsten, tungsten-nitride, tantalum and tantalum-nitride.

27. The method according to claim 26, wherein the conductive layer has a thickness of about 10 Å to about 350 Å and substantially surrounds the patterned metal line.

28. The method according to claim 24, wherein the conductive layer comprises a material having a melting point of about 1500° C. to about 3500° C.

29. The method according to claim 25, comprising forming the conductive layer in and substantially covering the trough by:

forming a first conductive layer in and substantially covering the trough, and forming a second conductive layer on the first conductive layer.

30. The method according to claim 29, wherein the first conductive layer comprises titanium-nitride and the second conductive layer comprises titanium.

31. The method according to claim 30, wherein the first conductive layer has a thickness of about 50 Å to about 1000 Å and the second conductive layer has a thickness of about 10 Å to about 350 Å.

32. The method according to claim 30, wherein the patterned metal line comprises Al or an alloy thereof.

33. The method according to claim 24, wherein the step of forming a conductive layer on at least the side surfaces of the trough includes the step of forming one or more sidewall spacers on the side surfaces of the trough.

* * * * *